(12) United States Patent
    Mani

(10) Patent No.: US 9,123,427 B2
(45) Date of Patent: Sep. 1, 2015

(54) SEMICONDUCTOR INTEGRATED CIRCUIT FOR LOW AND HIGH VOLTAGE OPERATIONS

(71) Applicant: III Holdings 1, LLC, Wilmington, DE (US)

(72) Inventor: Krishnakumar Mani, San Jose, CA (US)

(73) Assignee: III HOLDINGS 1, LLC, Wilmington, DE (US)

( * ) Notice: Subject to any disclaimer, the term of this patent is extended or adjusted under 35 U.S.C. 154(b) by 16 days.

(21) Appl. No.: 13/954,899

(22) Filed: Jul. 30, 2013

(65) Prior Publication Data

US 2013/0308375 A1    Nov. 21, 2013

Related U.S. Application Data

(63) Continuation of application No. 12/901,845, filed on Oct. 11, 2010, now Pat. No. 8,526,221.

(51) Int. Cl.
    *G11C 11/00*     (2006.01)
    *G11C 11/16*     (2006.01)
    *G11C 5/06*      (2006.01)

(52) U.S. Cl.
    CPC ............ *G11C 11/165* (2013.01); *G11C 5/06* (2013.01); *G11C 11/161* (2013.01)

(58) Field of Classification Search
    CPC ....... G11C 11/165; G11C 11/161; G11C 5/06

USPC ............ 365/158, 63, 173; 257/316, 104, 374
See application file for complete search history.

(56) References Cited

U.S. PATENT DOCUMENTS

| | | | |
|---|---|---|---|
| 6,320,234 B1* | 11/2001 | Karasawa et al. | 257/371 |
| 7,084,437 B2 | 8/2006 | Kitamura et al. | |
| 7,649,765 B2 | 1/2010 | Mani | |
| 8,526,221 B2* | 9/2013 | Mani | 365/158 |
| 2005/0009210 A1* | 1/2005 | Hosotani | 438/3 |
| 2009/0278187 A1 | 11/2009 | Toba | |
| 2010/0162065 A1* | 6/2010 | Norman | 714/746 |
| 2010/0181549 A1 | 7/2010 | Kim et al. | |

* cited by examiner

*Primary Examiner* — Toan Le
(74) *Attorney, Agent, or Firm* — McAndrews, Held & Malloy, Ltd.

(57) ABSTRACT

A semiconductor integrated circuit comprising a first circuit area for a low voltage operation and a second circuit area for a high voltage operation. The circuit areas comprise two vertically stacked backend patterned metal layers that are separated by an inter-metallic dielectric (IMD). The two metal layers and the IMD form a combination that is operable at the low voltage. The first circuit area uses a first portion of the combination for operating at the low voltage and the second circuit area uses a second portion of the combination for routing at the high voltage, the two metal layers in the second portion being interconnected through the IMD by via hole, for withstanding the high voltage. The first portion may comprise an array of magnetic random access memory (MRAM) devices and the second circuit area may comprise a display drive circuit.

20 Claims, 3 Drawing Sheets

SEMICONDUCTOR INTEGRATED CIRCUIT FOR LOW AND HIGH VOLTAGE OPERATIONS

This application is a continuation of U.S. patent application Ser. No. 12/901,845 filed Oct. 11, 2010, the specification of which is hereby incorporated herein by reference.

FIELD

Embodiments of the invention relate to a semiconductor integrated circuit for low and high voltage operations. More particularly, embodiments of the invention relate to magnetic random access memory (MRAM) device(s).

BACKGROUND

Semiconductor integrated circuits may be manufactured using semiconductor processing technologies such as complementary metal-oxide-semiconductor (CMOS), bipolar-junction-transistor and CMOS (BiCMOS), silicon-on-insulator (SOI) and the like. Each of these semiconductor processing technologies may be used to build integrated circuits that can operate at and withstand certain operating voltage levels. A semiconductor processing technology may be classified as a low voltage process, when an integrated circuit manufactured thereby is operable at a low voltage, say at less than 1.8 volts. Similarly, a semiconductor processing technology may be classified as a high voltage process, when an integrated circuit manufactured thereby may be operable at a high voltage, say at higher than 3.3 volts. The magnitudes of the voltage levels given above are for illustrative purpose only and may be defined differently for distinguishing between the high voltage and the low voltage levels of operation.

Backend processing of semiconductor integrated circuits include parameters and design considerations such as:
- the metal line width and spacing in a patterned metal layer;
- the thickness of the metal layer;
- the material composition of the metal layer;
- the material composition of the inter-metallic dielectric;
- the thickness of the inter-metallic dielectric;
- the resistance of the metal lines and the capacitance arising due to the metal lines and the inter-metallic dielectric, the resistance and the capacitance affecting the speed of the integrated circuit;
- the reliability in terms of the breakdown voltage; and
- the layout and schedule.

In some cases, integrated circuits may be implemented as a combination of a logic circuit and a memory circuit, in a single piece of semiconductor. The method of implementing the memory circuit along with the logic circuit is known as embedding the memory circuit in an integrated circuit. If the memory circuit and the logic circuit require the same operating voltage levels, it is easier to embed the memory circuit into the integrated circuit. If the voltage requirements or the operating voltage of the memory circuit is much smaller than the operating voltage of the logic circuit, it is often a challenge to integrate the memory circuit as aforesaid.

Magnetic random access memory (MRAM) devices may be integrated in a backend semiconductor process by using two of the backend metal layers and the inter-metallic dielectric (IMD) between them. The two metal layers used for forming the MRAM devices are optimized to be thinner than the thickness desirable for routing at high voltage levels. Similarly, the IMD used for forming the MRAM devices is thinner than that required for withstanding a high voltage level. Typically, MRAM devices are operable at a low voltage level.

SUMMARY OF THE INVENTION

In one embodiment, the invention discloses a semiconductor integrated circuit (IC), comprising a first circuit area for operating at a low voltage level (LVL) and a second circuit area for operating at a high voltage level (HVL). The first and second circuit areas comprise two vertically stacked backend patterned metal layers that are separated from each other by an inter-metallic dielectric (IMD). The two metal layers and the IMD form a combination and have corresponding physical dimensions that are suitable for operating at the LVL. The first circuit area uses a first portion of the combination for operating at the LVL and the second circuit area uses a second portion of the combination for routing at the HVL, the two metal layers in the second portion being interconnected through the IMD by at least one via hole, for withstanding the HVL.

An advantage of embodiments of the present invention is that the combination that is designed to be suitable for operating at the LVL in terms of materials and physical dimensions, can also be used for routing at the HVL that otherwise would need to be accommodated in other backend patterned metal layers that are suitable for routing the HVL. This approach of using the combination for routing at the HVL helps in handling increased complexity that is concomitant with increased density of the backend patterned metal layers without change in the metal line width and spacing being required for routing at the HVL.

In one embodiment, the LVL comprises a direct current (DC) voltage that is lower than about 3.3 volts and the HVL comprises a DC voltage that is higher than about 3.3 volts. The LVL may also comprise a plurality of voltage magnitudes. Similarly the HVL may also comprise a plurality of voltage magnitudes, for addressing various circuit requirements. Advantageously, embodiments of the present invention are not limited to any particular regime of the LVL or the HVL, thereby adding to the flexibility of application.

In another embodiment, the first circuit area comprises at least one or at least one array of MRAM device(s) formed within the first portion of the combination, wherein the device comprises two electrodes and a thin insulating layer for separating the electrodes, such that the two electrodes correspondingly connect to the two metal layers within the device and the thin insulating layer is configured within the IMD. In this embodiment, advantageously, the combination is suitable for routing power to an embedded MRAM device in terms of physical dimensions and materials, yet is usable for routing at the HVL.

The MRAM device may be operable by one of the following methods:
a) field Induced switching,
b) spin torque transfer/spin transfer switching, and
c) thermally assisted switching.

Advantageously, the present invention is not limited to any particular type(s) of the operating method for the MRAM device.

The MRAM device may be embedded in a high voltage semiconductor process, such as one based on one of the following process technologies:
a) complementary metal-oxide-semiconductor (CMOS),
b) bipolar-junction-transistor and CMOS (BiCMOS) and
c) silicon-on-insulator (SOI).

Advantageously, the present invention is not limited to any particular type(s) of the process technology.

In yet another embodiment, the second circuit area comprises a display driver circuit, such that in operation, the MRAM devices serve as memory for the display driver circuit.

In yet another embodiment, the two metal layers in the second portion are interconnected through the IMD by a plurality of via holes disposed in at least one array. An advantage of this embodiment is in reducing the resistance for routing at the HVL without significantly increasing the inter-metallic capacitance, for improved circuit performance.

In yet another embodiment, at least one more vertically stacked backend patterned metal layer is provided for addressing circuit complexity.

In yet another embodiment, the two metal layers are a second and a third metal layers in a backend process. From the processing point of view, it may be advantageous to fabricate the MRAM device(s) at earlier stages of the backend processing.

In yet another embodiment, the thicknesses of the second metal layer and the third metal layer are about 2500 Å each and the thickness of the IMD is about 1100 Å. Such dimensions may be suitable for forming the MRAM device(s) and also for using the combination for routing at the HVL.

In yet another embodiment, the IMD in the combination comprises silicon dioxide ($SiO_2$), a material that may be desirable for the fabrication of the MRAM device(s).

In a second aspect of the invention, a semiconductor IC comprises a first circuit area for operating at a LVL and a second circuit area for operating at a HVL. The first and second circuit areas comprise two vertically stacked backend patterned metal layers that are separated from each other by an inter-metallic dielectric (IMD), the two metal layers and the IMD forming a combination having corresponding physical dimensions for operating at the LVL. The first circuit area uses a first portion of the combination for operating at the LVL and the second circuit area using a second portion of the combination for routing at the HVL, the two metal layers in the second portion being interconnected through the IMD by at least one via hole for withstanding the HVL. The first circuit area herein comprises an array of MRAM devices formed within the first portion of the combination, wherein each device comprises two electrodes and a thin insulating layer for separating the two electrodes, such that the two electrodes correspondingly connect to the two metal layers within the device and the thin insulating layer is configured within the IMD.

An advantage of the second aspect of the present invention is that the combination that is designed to be suitable for the operation of the MRAM device at the LVL in terms of the physical dimensions and the material can also be used for routing at the HVL that otherwise would need to be accommodated in other metal layers that are suitable for HVL. This approach would help in handling increased complexity that is concomitant with an increased density of backend patterned metal layers.

In yet another embodiment of the second aspect of the invention, the second circuit area comprises a display driver circuit such that in operation the MRAM devices serve as memory for the display driver circuit.

In a third aspect of the invention, a semiconductor IC comprises a first circuit area for operating at a LVL and a second circuit area for operating at a HVL. The first and second circuit areas comprise two vertically stacked backend patterned metal layers that are separated from each other by an inter-metallic dielectric (IMD). The two metal layers and the IMD form a combination and have corresponding physical dimensions for operating at the LVL. The first circuit area uses a first portion of the combination for operating at the LVL and the second circuit area using a second portion of the combination for routing at the HVL, the two metal layers in the second portion being interconnected through the IMD by at least one via hole for withstanding the HVL. The first circuit area comprises an array of MRAM devices formed within the first portion of the combination, wherein each device comprises two electrodes and a thin insulating layer for separating the electrodes, such that the two electrodes correspondingly connect to the two metal layers within the device and the thin insulating layer is configured within the IMD. The second circuit area further comprises a display driver circuit, such that in operation the MRAM devices serve as memory for the display driver circuit.

An advantage of the third aspect of the present invention is that the combination that is designed to be suitable for the operation of the MRAM devices at the LVL in terms of the physical dimensions and the material, can also be used for routing at the HVL, for the display driver circuit, that otherwise would need to be accommodated in other metal layers that are suitable for HVL. This approach under the present invention would help in handling increased complexity with an increased density of backend metal layers.

More details on the embodiments of the invention will be apparent from the detailed description below.

DETAILED DESCRIPTION

Figure 1:
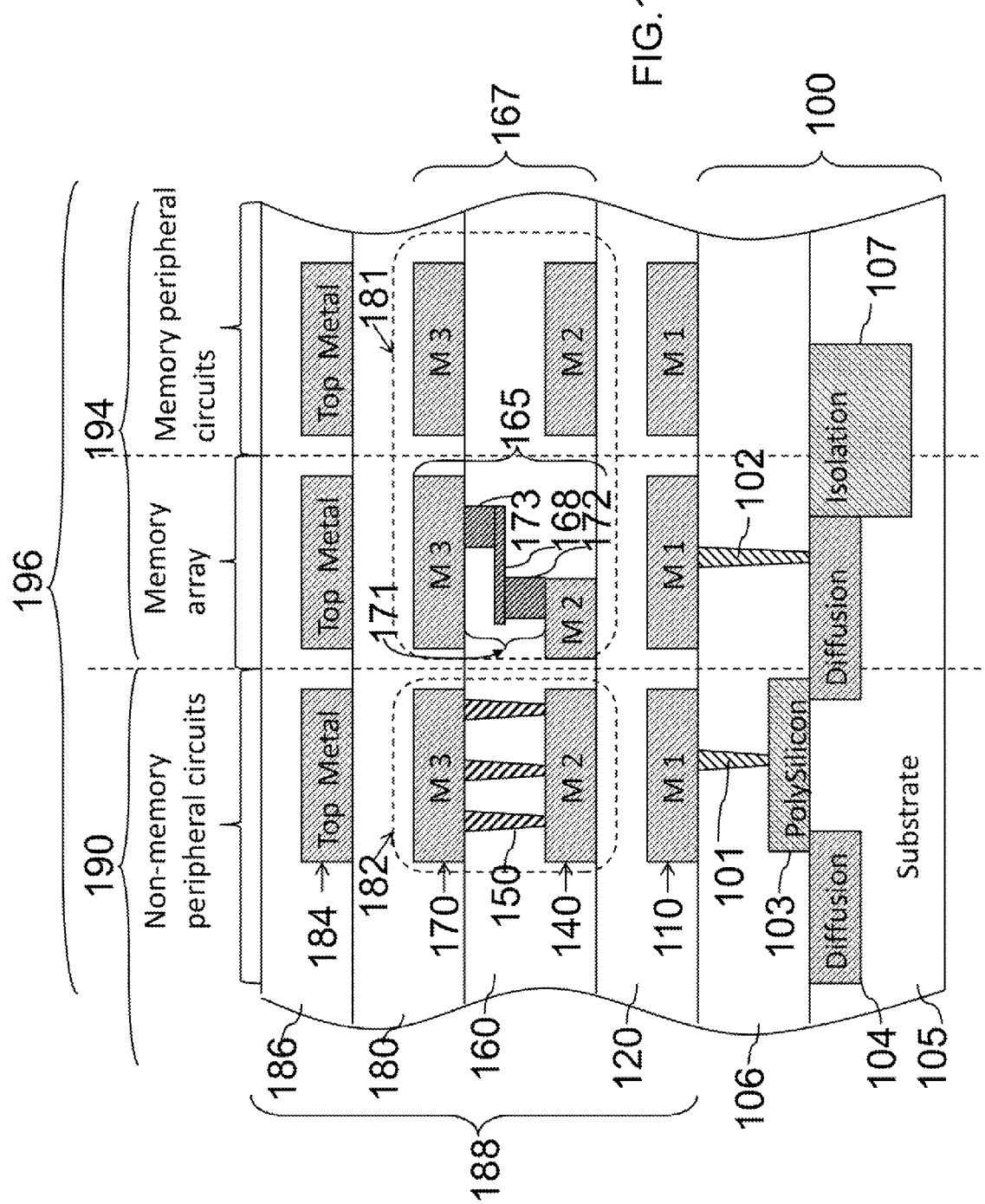
FIG. 1 illustrates a cross sectional view of an embedded MRAM device in a high voltage semiconductor process, according to an embodiment of the present invention.

In the following description, for purposes of explanation, numerous specific details are set forth in order to provide a thorough understanding of the invention. It will be apparent, however, to one skilled in the art that the invention can be practiced without these specific details.

Reference in this specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

One embodiment of the present invention provides a novel semiconductor IC, comprising a first circuit area for operating at a LVL and a second circuit area for operating at a HVL. The first and second circuit areas comprise two vertically stacked backend patterned metal layers that are separated from each other by an inter-metallic dielectric (IMD). The two metal layers and the IMD form a combination and have corresponding physical dimensions that are suitable for operating at the LVL. The first circuit area uses a first portion of the combination for operating at the LVL. The term 'operating' means operating one or a plurality of devices as well as routing at the LVL. A feature of this embodiment is that the second circuit area uses a second portion of the combination for routing at the HVL, the two metal layers in the second portion being interconnected through the IMD by at least one via hole for withstanding the HVL. With such an arrangement, the combination that is designed to be suitable for operation at the LVL in terms of its material(s) and physical dimensions can also be used for routing at the HVL that otherwise would need to be accommodated in other metal layers that are suitable for HVL routing in terms of materials and physical dimensions. This approach helps in handling increased complexity that is concomitant with increased density of backend metal lines. The physical dimensions under consideration for the combination are the metal line width and the spacing in the two patterned metal layers, the thicknesses of the metal layers and the IMD thickness. The materials under consideration are the material compositions for the IMD and the two metal layers.

The LVL comprises a DC voltage that is lower than about 3.3 volts and the HVL comprises a DC voltage that is higher than about 3.3 volts. There may however be several ways of defining the LVL and the HVL regimes. The voltage of about 3.3 volts herein refers to a value of 3.3 volts±0.5 volts in order to account for variations and fluctuations in operation. The LVL may comprise any number of different voltage magnitudes such as 3.3, 3.0, 2.5, 1.5, 1.2 and 1.0 volts within the typical ranges of variations found in the semiconductor field. Similarly, the HVL may comprise any number of voltage magnitudes such as 12, 18, 32, 350, 500 and 650 volts, again within the typical ranges of variations found in the semiconductor field. The choice of the magnitude for use may be dependent on the application. It may however be understood that the specification of 3.3 volts to differentiate between the HVL and the LVL herein, is only exemplary and does not limit the scope of the invention to this value. The basic criteria to distinguish between the HVL and the LVL are by the differences in the process and the design considerations that are adopted to address operations at these two voltage levels.

Referring to FIG. 1, the cross-sectional view of an embedded MRAM device in a high voltage semiconductor process illustrates an exemplary section 196 of a semiconductor IC comprising a first circuit area 194 for operating at the LVL and a second circuit area 190 for operating at the HVL. The first circuit area 194 and the second circuit area 190 comprise the two vertically stacked backend patterned metal layers shown indicated by reference numeral 140 (M 2) and reference numeral 170 (M 3), that are separated from each other by an inter-metallic dielectric (IMD) 160. The two metal layers 140, 170 and the IMD 160 form a combination 167 having corresponding physical dimensions for operating at the LVL. The first circuit area 194 uses a first portion 181 of the combination 167 for operating at the LVL, whereas the second circuit area 190 uses a second portion 182 of the combination 167 for routing at the HVL. The two metal layers 140, 170 in the second portion 182 are interconnected through the IMD 160 by at least one via hole 150 for withstanding the HVL. The first circuit area 194 comprises an MRAM device 165 formed within the first portion 181 of the combination 167. The MRAM device 165 comprises a magnetic tunnel junction (MTJ) to form a magnetic storage element 171, wherein the MTJ comprises, 168 bottom electrode or seed layer, 173 a stack of ferromagnetic layers and an insulating layer. The bottom electrode or seed layer is connected to M2 by Via 172. Thus the storage element 171 is connected to the two metal layers 140, 170 respectively. The connections for the MRAM device 165 with respect to a corresponding word line and a corresponding bit line are not shown. The thickness of the metal layer 140 is lowered for achieving higher magnetic fields in the MRAM device 165. A memory circuit may comprise a plurality of MRAM devices 165 disposed in an array. The MRAM device 165 is merely illustrative of a type of device operable at the LVL. Thus, it is to be understood that the invention is equally applicable when some other type of device that is operable at the LVL, other than an MRAM device 165, is embedded in the combination 167.

The rest of the FIG. 1 illustrates certain features typically found in an IC. These features include an interconnect metal layer 110 (M 1) for making contact to diffusion areas 104 in the semiconductor substrate 105 by means of contact holes 102 through a dielectric layer 106. The substrate 105 typically also includes isolation areas 107. A polysilicon layer 103 that typically could serve as a gate electrode in a metal-oxide-semiconductor field-effect transistor (MOSFET) or as a resistor, is also shown. The metal layer 110 is shown to make contact with the polysilicon layer 103 by means of the contact hole 101. The metal layer 110 is isolated from the metal layer 140 by a dielectric layer 120. The structure below the metal layer 110 is typically known as a frontend 100 and the structure at the metal layer 110 and above is typically known as the backend 188. The backend 188 may comprise any number of metal layers, as required by the application of the IC. FIG. 1 shows a four layer metal architecture. A top patterned metal layer 184 (Top Metal) is vertically stacked over the metal layer 170 with an isolating dielectric layer 180 separating the two metal layers 170, 184. An isolating dielectric layer 186 is shown above the metal layer 184, through which pad windows (not shown) are opened for bonding the IC with a package or for making any other external electrical connection to the IC.

FIG. 1 shows a possible arrangement for embedding the MRAM device 165 within the combination 167, for operation at the LVL. The physical dimensions and the material(s) in the combination 167 can also be used for routing at the HVL.

In an exemplary process technology, the thicknesses for the two metal layers 140, 170 are about 2500 Å each and the IMD 160 is about 1100 Å. The required thicknesses for routing at the HVL is about 4300 Å for each of the two metal layers 140,170 and about 4300 Å for the IMD 160. By interconnecting the two metal layers 140, 170, a total metal thickness of about 5000 Å is achieved, which is more than the thickness of 4300 Å that is required for routing at the HVL. Besides, with the interconnection, since the two metal layers 140, 170 are at the same voltage, the issue of dielectric breakdown at the thinner IMD 160 is automatically resolved. The term 'about' used in conjunction with the numerical values provided herein is to be interpreted to permit a ±10% variance. All such physical dimensions and materials are however dependent on the process technology used for fabrication of the IC and the scope of the present invention is not limited by any such physical dimension or material.

Under embodiments of the present invention, the MRAM device 165 may be operable by any method, such as by field induced switching, by spin torque transfer/spin transfer switching, by thermally assisted switching or by any other method. The scope of the present invention does not limit the method of operation of the MRAM device 165.

The MRAM device 165 may be embedded in any high voltage semiconductor process, such as one based on a process technology such as complementary metal-oxide-semiconductor (CMOS), bipolar-junction-transistor and CMOS (BiCMOS), and silicon-on-insulator (SOI).

The second circuit area 194 may comprise a display driver circuit (not shown), such that in operation, the MRAM device (s) 165 serve as memory for the display driver circuit. However, the present invention may be applied with any other high voltage circuit as required by the application of the IC.

Apart from the two metal layers 140, 170, more vertically stacked backend patterned metal layer(s) may be provided for addressing circuit complexity. The scope of the present invention does not in any way limit the number of metal layers used in the backend of the IC, as long as the two metal layers 140, 170 for forming the combination 167 are available. The present invention is applicable with any backend metallization process where minimum two metal layers are available. In FIG. 1, the metal layer 184 is shown above the combination 167 and the metal layer 110 is shown below the combination 167.

The two metal layers 140, 170 for forming the combination 167 may be a second metal layer and a third metal layer, in a backend process. From the processing point of view it may be advantageous to fabricate the MRAM device(s) 165 at earlier stages of the backend processing. However, the scope of the present invention does not limit the configuration of the MRAM device(s) 165 to any particular pair of consecutive metal layers in the backend process. The MRAM device(s) 165 may as well be distributed within more than one pair of such consecutive metal layers such that more than one combination 167 are formed that are also suitably interconnected for routing at the HVL.

The IMD 160 in the combination 167 may comprise silicon dioxide ($SiO_2$), a material that may be desirable in the fabrication of the MRAM device(s) 165, as opposed to other materials such as fluorosilicate glass (FSG) and Strontium oxide (SRO), that are typically used as the inter-metallic dielectric layers. The FSG has a lower dielectric constant as compared to that of $SiO_2$ and is widely adopted for semiconductor fabrication, particularly on geometries sub 0.25 micron meter, for maintaining a lower inter-metallic capacitance for increasing the speed of the circuit. A thin SRO layer is typically sandwiched between the FSG and the metal layer for improved bonding of the metal layer with the FSG.

Figure 2A:
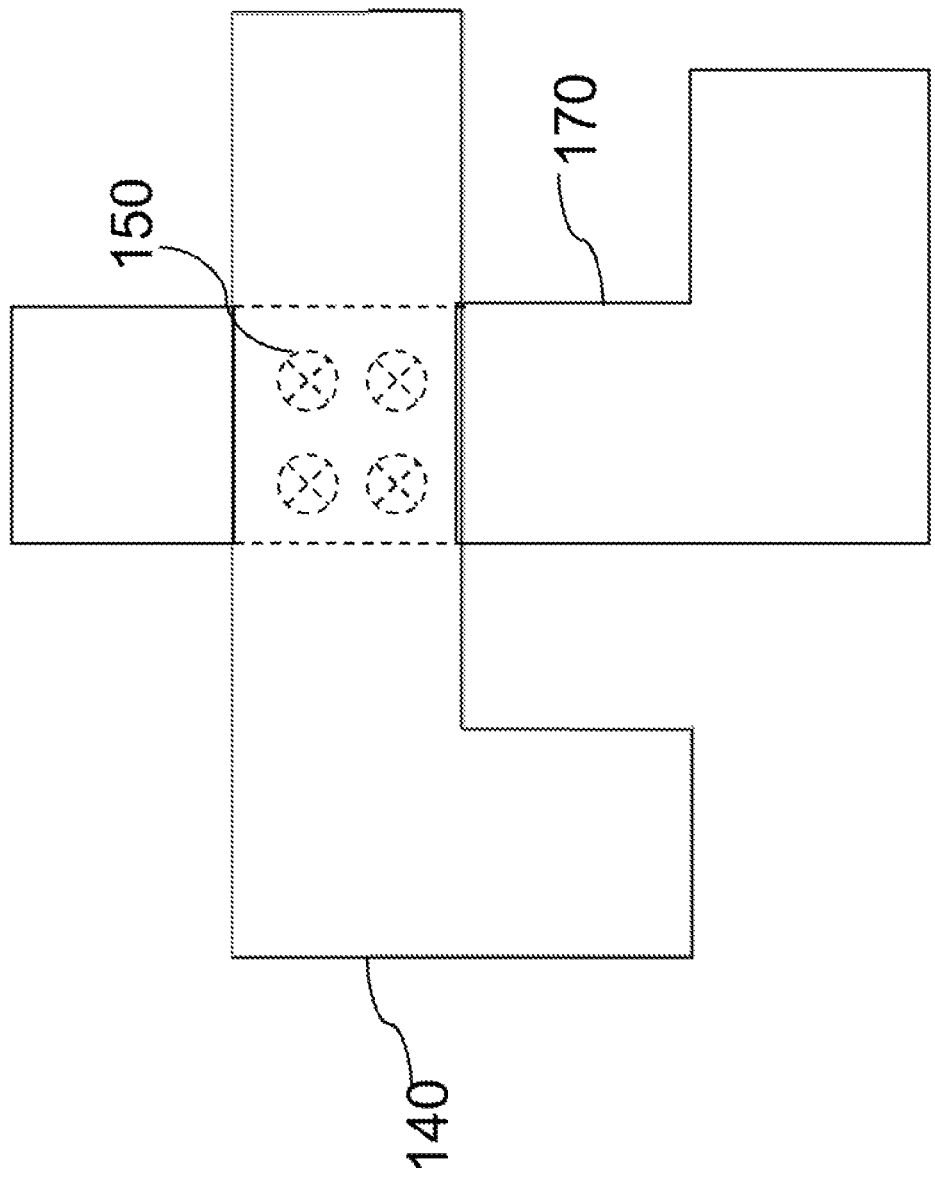
FIG. 2a illustrates a section of a typical layout configuration of two metal lines of the two metal layers in the combination, when running perpendicular to each other. According to an embodiment of the present invention, the two metal lines are interconnected through the inter-metallic dielectric by via holes at the location of overlap between the two lines, for withstanding HVL while routing.
Figure 2B:
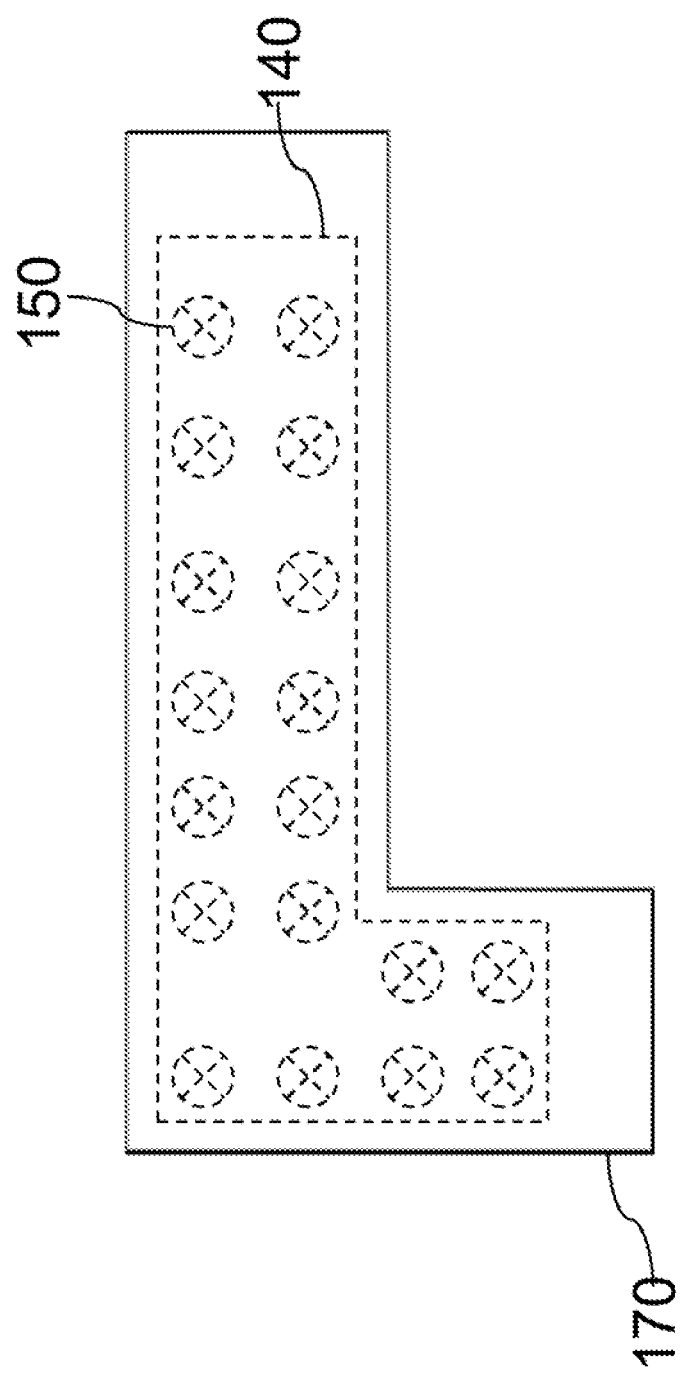
FIG. 2b illustrates a section of a typical layout configuration of two metal lines of the two metal layers in the combination, when running one over the other. According to an embodiment of the present invention, the two metal lines are interconnected through the inter-metallic dielectric by via holes at the location of overlap between the two metal lines, for withstanding HVL while routing.

When the two metal layers 140, 170 in the second portion 182 are interconnected through the IMD 160 by a plurality of via holes 150, the layout may be as illustrated in FIG. 2a. As will be seen, the via holes 150 are positioned where two metal lines of the two metal layers 140, 170 overlap, while being mutually at right angles. Another layout that may be adopted is as illustrated in FIG. 2b, where two metal lines of the two metal layers 140, 170 run one over the other in overlapping fashion. As may be understood by those skilled in the art, this configuration will accommodate more number of the via holes 150 and further help in reducing the resistance for routing at the HVL as well as keeping 140 and 170 at the same potential to avoid dielectric breakdown in HVL. However, any other type of layout may equally be used, without any compromise on the scope of application of the present invention, as long as the two metal layers 140, 170 are interconnected for routing at the HVL. The plurality of via holes 150 may or may not be in the form of an array or in a plurality of arrays.

Although the present invention has been described with reference to specific exemplary embodiments, it will be evident that the various modification and changes can be made to these embodiments without departing from the broader spirit of the invention. Accordingly, the specification and drawings are to be regarded in an illustrative sense rather than in a restrictive sense.

The invention claimed is:

1. A circuit, comprising:
   a first circuit area configured to operate based on a first voltage level; and
   a second circuit area configured to operate based on a second voltage level that is greater than the first voltage level;
   a plurality of patterned metal layers configured to interconnect one or more circuit elements of the first circuit area and the second circuit area, wherein the plurality of patterned metal layers are separated from each other by a corresponding dielectric layer, and wherein each patterned metal layer and corresponding dielectric layer is dimensioned for operation at the first voltage level; and
   one or more vias interconnected between one or more portions of the plurality of patterned metal layers that correspond to the second circuit area, wherein the one or more portions and the one or more vias form one or more interconnects for the second circuit area that are suitable for operating at the second voltage level.

2. The circuit of claim 1, wherein the first voltage level comprises a direct current (DC) voltage that is lower than about 3.3 volts and the second voltage level comprises a DC voltage that is higher than about 3.3 volts.

3. The circuit of claim 1, wherein the first voltage level comprises a plurality of voltage magnitudes.

4. The circuit of claim 1, wherein the second voltage level comprises a plurality of voltage magnitudes.

5. The circuit of claim 1, wherein:
   the first circuit area comprises a magnetic random access memory (MRAM) device;
   the MRAM device includes two electrodes and a thin insulating layer separating the two electrodes;
   the two electrodes are connected to two patterned metal layers from the plurality of patterned metal layers; and
   the corresponding dielectric layer for the two patterned metal layers comprises the thin insulating layer.

6. The circuit of claim 1, wherein:
   the first circuit area comprises at least one array of magnetic random access memory (MRAM) devices;
   each MRAM device of the at least one array of MRAM devices comprises two electrodes and a thin insulating layer for separating the two electrodes;
   the two electrodes of a respective MRAM device are connected to two patterned metal layers from the plurality of patterned metal layers; and
   the corresponding dielectric layer for the two patterned metal layers comprises the thin insulating layer.

7. The circuit of claim 5, wherein a magnetic storage element of the MRAM device is configured to operate by field-induced switching.

8. A circuit, comprising:
   a substrate including first circuit elements configured to operate based on a first voltage level and second circuit elements configured to operate based on a second voltage level that is greater than the first voltage level;
   a first patterned metal layer that interconnects one or more circuit elements of the first circuit area and the second circuit area, wherein the first patterned metal layer has sufficient thickness for sustained operation at the first voltage level but insufficient thickness for sustained operation at the second voltage level;
a dielectric layer on the first patterned metal layer, wherein the dielectric layer has sufficient thickness for sustained operation at the first voltage level but insufficient thickness for sustained operation at the second voltage level;
a second patterned metal layer on the dielectric layer, wherein the second patterned metal layer has sufficient thickness for sustained operation at the first voltage level but insufficient thickness for sustained operation at the second voltage level; and
one or more vias that interconnect portions of the first patterned metal layer with portions of the second patterned metal layer that are associated with the second circuit elements to form a combination having an effective thickness suitable for sustained operation at the second voltage level.

9. The circuit of claim 8, wherein the first voltage level comprises a direct current (DC) voltage that is lower than about 3.3 volts and the second voltage level comprises a DC voltage that is higher than about 3.3 volts.

10. The circuit of claim 8, wherein the first voltage level comprises a plurality of voltage magnitudes.

11. The circuit of claim 8, wherein the second voltage level comprises a plurality of voltage magnitudes.

12. The circuit of claim 8, wherein:
the first circuit elements comprise a magnetic random access memory (MRAM) device;
the MRAM device includes two electrodes and a thin insulating layer separating the two electrodes;
the first patterned metal layer comprises one of the two electrodes of the MRAM device;
the second patterned metal layer comprises the other of the two electrodes of the MRAM device; and
the dielectric layer comprises the thin insulting layer of the MRAM device.

13. The circuit of claim 12, wherein a magnetic storage element of the MRAM device is configured to operate by spin torque transfer/spin transfer switching.

14. The circuit of claim 8, wherein:
the first circuit elements comprise at least one array of magnetic random access memory (MRAM) devices;
each MRAM device from the at least one array of MRAM devices comprises two electrodes and a thin insulating layer separating the two electrodes;
the first patterned metal layer comprises one of the two electrodes of each MRAM device from the at least one array of MRAM devices;
the second patterned metal layer comprises the other of the two electrodes of each MRAM device from the at least one array of MRAM devices; and
the dielectric layer comprises the thin insulting layer of each MRAM device from the at least one array of MRAM devices.

15. A method, comprising:
forming, in a substrate, first circuit elements configured to operate based on a first voltage level and second circuit elements configured to operate based on a second voltage level that is greater than the first voltage level;
forming a first patterned metal layer that interconnects one or more circuit elements of the first circuit area and the second circuit area, wherein the first patterned metal layer has sufficient thickness for sustained operation at the first voltage level but insufficient thickness for sustained operation at the second voltage level;
forming a dielectric layer on the first patterned metal layer, wherein the dielectric layer has sufficient thickness for sustained operation at the first voltage level but insufficient thickness for sustained operation at the second voltage level;
forming a second patterned metal layer on the dielectric layer, wherein the second patterned metal layer has sufficient thickness for sustained operation at the first voltage level but insufficient thickness for sustained operation at the second voltage level; and
interconnecting portions of the first patterned metal layer with portions of the second patterned metal layer that are associated with the second circuit elements to form a combination having an effective thickness suitable for sustained operation at the second voltage level.

16. The method of claim 15, wherein said interconnecting comprises forming a via that connects the first patterned metal layer to the second patterned metal layer.

17. The method of claim 15, wherein said interconnecting comprises forming an array of vias that connects the first patterned metal layer to the second patterned metal layer.

18. The method of claim 15, wherein:
said forming a first patterned metal layer comprises forming the first patterned metal layer with a thickness for sustained operation at the first voltage level that is lower than 3.3 volts; and
said forming a second patterned metal layer comprises forming the second patterned metal layer with a thickness for sustained operation at the second voltage level that is higher than 3.3 volts.

19. The method of claim 15, wherein said forming a first patterned metal layer, said forming a dielectric layer, and said forming a second patterned metal layer comprises forming a magnetic random access memory (MRAM) device.

20. The method of claim 19, wherein said forming an MRAM device comprises forming a magnetic storage element of the MRAM device that is operated by thermally-assisted switching.

\* \* \* \* \*